(12) United States Patent
Nagano et al.

(10) Patent No.: US 6,721,551 B2
(45) Date of Patent: Apr. 13, 2004

(54) TRANSMITTING AND RECEIVING APPARATUS

(75) Inventors: Hiroaki Nagano, Tokyo (JP); Kazuhiro Mori, Tokyo (JP); Kenji Itoh, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 218 days.

(21) Appl. No.: 09/968,773

(22) Filed: Oct. 3, 2001

(65) Prior Publication Data

US 2002/0037702 A1 Mar. 28, 2002

Related U.S. Application Data

(63) Continuation of application No. 09/679,449, filed on Oct. 4, 2000, now Pat. No. 6,324,385, which is a continuation of application No. PCT/JP99/00985, filed on Mar. 1, 1999.

(51) Int. Cl.$^7$ ................................................. H04B 1/26
(52) U.S. Cl. ...................................... 455/324; 455/260
(58) Field of Search .............................. 455/110, 205, 455/207, 260, 323, 324, 255, 256, 258, 259, 264, 315, 316

(56) References Cited

U.S. PATENT DOCUMENTS 5,530,929 A * 6/1996 Lindqvist et al. ........... 455/324
6,606,484 B1 * 8/2003 Faulkner ..................... 455/131

FOREIGN PATENT DOCUMENTS

| JP | 5854740 | 3/1983 |
| JP | 626329 | 4/1994 |
| JP | 1098409 | 4/1998 |

* cited by examiner

*Primary Examiner*—Nay Maung
*Assistant Examiner*—Nick Corsaro
(74) *Attorney, Agent, or Firm*—Rothwell, Figg, Ernst & Manbeck

(57) ABSTRACT

A reception carrier wave, a first transmission carrier wave, and a second transmission carrier wave are generated. The reception carrier wave is mixed with the reception wave to produce a reception signal. The frequency of the first transmission carrier wave is halved, and the first transmission carrier wave is mixed with a transmission signal to produce a modulated wave. The second transmission carrier wave is mixed with the modulated wave to produce a transmission wave. Since neither the frequency of the first transmission carrier wave nor the frequency of the second transmission carrier wave agrees with each of the frequency of the modulated wave and the frequency fTX, the degradation of the modulation precision on a transmission side can be prevented. Also, because the frequency of the first transmission carrier wave is halved, the interference of the first transmission carrier wave with the transmission signal band can be reduced.

2 Claims, 7 Drawing Sheets

TRANSMITTING AND RECEIVING APPARATUS

CROSS-REFERENCE TO RELATED APPLICATIONS

This application is a continuation of U.S. application Ser. No. 09/679,449, filed Oct. 4, 2000 now U.S. Pat. No. 6,324,385, which is a continuation of International Application No. PCT/JP99/00985, whose International filing date is Mar. 1, 1999, the disclosures of which are incorporated by reference herein in their entirety.

BACKGROUND OF THE INVENTION

1. Field of the Invention

The present invention relates to a transmitting and receiving apparatus arranged in a mobile wireless installation or the like.

2. Description of Related Art

FIG. 1 is a constitutional diagram showing a conventional transmitting and receiving apparatus. In FIG. 1, 1 indicates an antenna, 2 indicates a duplexer (hereinafter, called DUP) for outputting a reception wave Rx received in the antenna 1 to a receiving unit 9 and outputting a transmission wave TX output from a transmitting unit 14, 3 indicates a carrier wave generating unit for generating a reception carrier wave L0 having the same frequency as a reception frequency $f_{RX}$ of the reception wave Rx and generating a transmission carrier wave L1 having the same frequency as a transmission frequency $f_{TX}$ of the transmission wave TX, 4 indicates a local oscillating unit, 5 indicates a phased-lock-loop (hereinafter, called PLL) for generating the reception carrier wave L0 having a frequency $f_{L0}$ (=$f_{RX}$), 6 indicates a distributing unit for distributing the reception carrier wave L0 generated in the PLL 5, 7 indicates a PLL for generating a signal of which a frequency is equivalent to a difference value between the frequency $f_{Rx}$ and the frequency $f_{TX}$, and 8 indicates a mixer (hereinafter, called MIX) for mixing the signal generated in the PLL 7 with the reception carrier wave L0 and outputting the transmission carrier wave L1.

Also, 9 indicates the receiving unit for mixing the reception carrier wave L0 generated in the carrier wave generating unit 3 with the reception wave Rx and outputting a reception signal, 10 indicates an amplifying unit for amplifying the reception wave Rx, 11 indicates a band pass filter, 12 indicates a filter for removing higher harmonic waves from the reception carrier wave L0 generated in the carrier wave generating unit 3, and 13 indicates an MIX for mixing the reception carrier wave L0 with the reception wave Rx.

In addition, 14 indicates the transmitting unit for mixing the transmission carrier wave L1 generated in the carrier wave generating unit 3 with the transmission signal and outputting the transmission wave Tx, 15 indicates a filter for removing higher harmonic waves from the transmission carrier wave L1 generated in the carrier wave generating unit 3, 16 indicates an MIX for mixing the transmission carrier wave L1 with the transmission signal, 17 indicates a band pass filter, and 18 indicates an amplifier for amplifying the transmission wave Tx. Next, an operation is described.

In this transmitting and receiving apparatus, the transmission of the transmission wave Tx and the reception of the reception wave Rx are simultaneously performed. However, a direct converter method is adopted to reduce both a size of the receiving unit 9 and a size of the transmitting unit 14. In this direct converter method, the reception wave Rx is directly converted into the reception signal of a desired frequency, and the transmission signal is directly converted into the transmission wave Tx of a desired frequency.

More precisely, the reception carrier wave L0 having the same frequency as the reception frequency $f_{RX}$ of the reception wave Rx is generated in the carrier wave generating unit 3 to directly obtain the reception signal of the desired frequency from the reception wave Rx.

Thereafter, when the reception carrier wave L0 of the frequency $f_{L0}$, which agrees with the reception frequency $f_{RX}$, is generated in the carrier wave generating unit 3, the reception carrier wave L0 is mixed with the reception wave Rx in the receiving unit 9, and the reception signal is output from the receiving unit 9.

Therefore, the reception signal of the desired frequency can be taken in.

Also, because the transmission carrier wave L1 having the same frequency as the transmission frequency $f_{TX}$ of the transmission wave Tx is generated in the carrier wave generating unit 3 to directly obtain the transmission wave Tx of the transmission frequency $f_{TX}$ from the transmission signal.

Thereafter, when the transmission carrier wave L1, of which the frequency $f_{L1}$ agrees with the transmission frequency $f_{TX}$, is generated in the carrier wave generating unit 3, the transmission carrier wave L1 is mixed with the transmission signal in the receiving unit 14, and the transmission wave Tx is output from the transmitting unit 14.

Therefore, the transmission signal Tx of the transmission frequency $f_{TX}$ can be transmitted.

Because the conventional transmitting and receiving apparatus has the above-described configuration, the size of the receiving unit 9 and the size of the transmitting unit 14 can be made small. However, because the frequency $f_{L0}$ of the reception carrier wave L0 agrees with the reception frequency $f_{Rx}$, the reception carrier wave L0 leaks out to a front end unit (the antenna 1 and the DUP 2) and functions as interference wave. Therefore, there is a problem that a DC offset occurs in the reception signal.

Also, because the frequency $f_{L1}$ of the transmission carrier wave L1 agrees with the transmission frequency $f_{TX}$, the transmission wave Tx leaks out to interfere with the carrier wave generating unit 3. As a result, there are following problems. That is, the transmission carrier wave L1 become unstable, a modulation precision of the transmitting unit 14 becomes worse, floor noise occurring in the modulating unit is increased, and electric power cannot be reduced in an electric power control operation which is performed in a CDMA or the like.

SUMMARY OF THE INVENTION

An object of the present invention is to provide, with due consideration to the drawbacks of the conventional transmitting and receiving apparatus, a transmitting and receiving apparatus in which the occurrence of a DC offset and the degradation of a modulation precision are prevented without increasing an area occupied by constituent elements of the transmitting and receiving apparatus.

The object is achieved by the provision of a transmitting and receiving apparatus, comprising;

carrier wave generating means for generating a reception carrier wave of which a frequency agrees with a reception frequency, generating a first transmission carrier wave of which a frequency is equivalent to 2N (N is a natural number) times of a difference value between the reception frequency and a transmission frequency, and generating a second transmission carrier wave of which a frequency is equivalent to a difference value between the frequency of the first transmission carrier wave and the reception frequency; receiving means for mixing the reception carrier wave generated by the carrier wave generating means with a reception wave and outputting a reception signal;

modulating means for de-multiplying by 2N the frequency of the first transmission carrier wave generated by the carrier wave generating means, mixing the first transmission carrier wave, of which the frequency is de-multiplied by 2N, with a transmission signal, and outputting a modulated wave; and transmitting means for mixing the second transmission carrier wave generated by the carrier wave generating means with the modulated wave output from the modulating means, and outputting a transmission wave.

Therefore, because the frequency of the transmission carrier wave does not agree with the transmission frequency, there is no probability that a transmission wave leaks out to interfere with a carrier wave generating means. As a result, the degradation of a modulation precision on a transmission side can be prevented, and a spuriously occurring wave can be easily attenuated in a filter.

In a transmitting and receiving apparatus according to the present invention, it is preferred that the second transmission carrier wave is generated by mixing the first transmission carrier wave and a reception carrier wave.

Therefore, in cases where a mixer, which can be easily arranged in an integrated circuit and can be made small, is used, it is not required to additionally arrange a PLL, and there is an effect that two transmission carrier waves, of which frequencies differ from each other, can be produced.

The object is also achieved by the provision of a transmitting and receiving apparatus, comprising;

carrier wave generating means for generating a reception carrier wave of which a frequency is equivalent to ½ of a reception frequency, generating a first transmission carrier wave of which a frequency is equivalent to 2N times (N is a natural number) of a difference value between the reception frequency and a transmission frequency, and generating a second transmission carrier wave of which a frequency is equivalent to 2N times of a difference value between ½N of the frequency of the first transmission carrier wave and ½ of the reception frequency;

receiving means for mixing the reception carrier wave generated by the carrier wave generating means with a reception wave and outputting a reception signal;

modulating means for de-multiplying by 2N the frequency of the first transmission carrier wave generated by the carrier wave generating means, mixing the first transmission carrier wave, of which the frequency is de-multiplied by 2N de-multiplying, with a transmission signal, and outputting a modulated wave; and transmitting means for mixing the second transmission carrier wave generated by the carrier wave generating means with the modulated wave output from the modulating means, and outputting a transmission wave.

Therefore, because the frequency of the reception carrier wave does not agree with the reception frequency, there is no probability that the reception carrier wave leaks out to a front end portion (antenna or DUP) to generate interference in a base band portion. Therefore a problem that a DC offset occurs in a receiving signal can be solved.

Also, because the frequency of the transmission carrier wave does not agree with the transmission frequency, there is no probability that a transmission wave leaks out to interfere with a carrier wave generating means. As a result, the degradation of a modulation precision on a transmission side can be prevented, and a spuriously occurring wave can be easily attenuated in a filter.

In a transmitting and receiving apparatus according to the present invention, it is preferred that the second transmission carrier wave is generated by de-multiplying by 2N the frequency of the first transmission carrier wave, mixing the first transmission carrier wave, of which the frequency is de-multiplied by 2N, with the reception carrier wave to produce a mixed wave and multiplying a frequency of the mixed wave by 2.

Therefore, in cases where a mixer, which can be easily arranged in an integrated circuit and can be made small, is used, it is not required to additionally arrange a PLL, and there is an effect that two transmission carrier waves, of which frequencies differ from each other, can be produced.

The object is also achieved by the provision of a transmitting and receiving apparatus, comprising;

carrier wave generating means for generating a reception carrier wave of which a frequency is equivalent to half of a reception frequency, generating a first transmission carrier wave of which a frequency is equivalent to 4 times of a difference value between the reception frequency and a transmission frequency, and generating a second transmission carrier wave of which a frequency is equivalent to a difference value between twice of the reception frequency and the transmission frequency;

receiving means for mixing the reception carrier wave generated by the carrier wave generating means with a reception wave and outputting a reception signal;

modulating means for de-multiplying by 2 the frequency of the first transmission carrier wave generated by the carrier wave generating means, mixing the first transmission carrier wave, of which the frequency is de-multiplied by 2, with a transmission signal, and outputting a modulated wave; and transmitting means for mixing the second transmission carrier wave generated by the carrier wave generating means with the modulated wave output from the modulating means, and outputting a transmission wave.

Therefore, there is no probability that an area occupied by elements of the transmitting and receiving apparatus is enlarged, the occurrence of a DC offset and the degradation of the modulation precision can be prevented, and there is an effect that a spuriously occurring wave can be easily attenuated in a filter.

In a transmitting and receiving apparatus according to the present invention, it is preferred that the second transmission carrier wave is generated by mixing a signal, of which a frequency is equivalent to ⅛ of the frequency of the first transmission carrier wave, with the reception carrier wave to produce a mixed wave and multiplying a frequency of the mixed wave by 2.

Therefore, in cases where a mixer, which can be easily arranged in an integrated circuit and can be made small, is used, it is not required to additionally arrange a PLL, and there is an effect that two transmission carrier waves, of which frequencies differ from each other, can be produced.

The object is also achieved by the provision of a transmitting and receiving apparatus, comprising;

carrier wave generating means for generating a reception carrier wave of which a frequency is equivalent to half of a reception frequency, generating a first transmission carrier wave of which a frequency is equivalent to 8N times (N is a natural number) of a difference value between the reception frequency and a transmission frequency, and generating a second transmission carrier wave of which a frequency is equivalent to a difference value between twice of the reception frequency and the transmission frequency;

receiving means for mixing the reception carrier wave generated by the carrier wave generating means with a reception wave and outputting a reception signal;

modulating means for de-multiplying by 2N the frequency of the first transmission carrier wave generated by the carrier wave generating means, mixing the first transmission carrier wave, of which the frequency is de-multiplied by 2N, with a transmission signal, and outputting a modulated wave; and transmitting means for mixing the second transmission carrier wave generated by the carrier wave generating means with the modulated wave output from the modulating means, and outputting a transmission wave.

Therefore, there is no probability that an area occupied by elements of the transmitting and receiving apparatus is enlarged, the occurrence of a DC offset and the degradation of the modulation precision can be prevented, and there is an effect that a spuriously occurring wave can be easily attenuated in a filter.

In a transmitting and receiving apparatus according to the present invention, it is preferred that the reception carrier wave is generated by de-multiplying the frequency of the first transmission carrier wave by 16N, de-multiplying the frequency of the second transmission carrier wave by 2 and mixing the first transmission carrier wave, of which the frequency is de-multiplied by 16N, and the second transmission carrier wave of which the frequency is de-multiplied by 2.

Therefore, in cases where a mixer, which can be easily arranged in an integrated circuit and can be made small, is used, it is not required to additionally arrange a PLL, and there is an effect that two transmission carrier waves, of which frequencies differ from each other, can be produced.

The object is also achieved by the provision of a transmitting and receiving apparatus, comprising;

carrier wave generating means for generating a reception carrier wave of which a frequency is equivalent to ½N (N is a natural number) of a reception frequency, generating a first transmission carrier wave of which a frequency is equivalent to a difference value between twice of a transmission frequency and the reception frequency, and generating a second transmission carrier wave of which a frequency is equivalent to ½N of the reception frequency;

receiving means for mixing the reception carrier wave generated by the carrier wave generating means with a reception wave and outputting a reception signal;

modulating means for de-multiplying by 2N the frequency of the first transmission carrier wave generated by the carrier wave generating means, mixing the first transmission carrier wave, of which the frequency is de-multiplied by 2N, with a transmission signal, and outputting a modulated wave; and transmitting means for mixing the second transmission carrier wave generated by the carrier wave generating means with the modulated wave output from the modulating means, and outputting a transmission wave.

Therefore, there is no probability that an area occupied by elements of the transmitting and receiving apparatus is enlarged, the occurrence of a DC offset and the degradation of the modulation precision can be prevented, and there is an effect that a spuriously occurring wave can be easily attenuated in a filter.

In a transmitting and receiving apparatus according to the present invention, it is preferred that a signal, of which a frequency is equivalent to ½N of the reception frequency, is generated as the reception carrier wave and the second transmission carrier wave.

Therefore, in cases where a mixer, which can be easily arranged in an integrated circuit and can be made small, is used, it is not required to additionally arrange a PLL, and there is an effect that two transmission carrier waves, of which frequencies differ from each other, can be produced.

The object is also achieved by the provision of a transmitting and receiving apparatus, comprising;

carrier wave generating means for generating a reception carrier wave and a first transmission carrier wave of which each frequency is equivalent to half of a reception frequency, and generating a second transmission carrier wave of which a frequency is equivalent to a difference value between ¼ of the reception frequency and a transmission frequency;

receiving means for mixing the reception carrier wave generated by the carrier wave generating means with a reception wave and outputting a reception signal;

modulating means for de-multiplying by 2 the frequency of the first transmission carrier wave generated by the carrier wave generating means, mixing the first transmission carrier wave, of which the frequency is de-multiplied by 2, with a transmission signal, and outputting a modulated wave; and transmitting means for mixing the second transmission carrier wave generated by the carrier wave generating means with the modulated wave output from the modulating means, and outputting a transmission wave.

Therefore, there is no probability that an area occupied by elements of the transmitting and receiving apparatus is enlarged, the occurrence of a DC offset and the degradation of the modulation precision can be prevented, and there is an effect that a spuriously occurring wave can be easily attenuated in a filter.

In a transmitting and receiving apparatus according to the present invention, it is preferred that a signal, of which a frequency is equivalent to half of the reception frequency, is generated as the reception carrier wave and the first transmission carrier wave.

Therefore, in cases where a mixer, which can be easily arranged in an integrated circuit and can be made small, is used, it is not required to additionally arrange a PLL, and there is an effect that two transmission carrier waves, of which frequencies differ from each other, can be produced.

DETAILED DESCRIPTION OF THE PREFERRED EMBODIMENTS

The invention will now be described with reference to the accompanying drawings.

Embodiment 1

Figure 2:
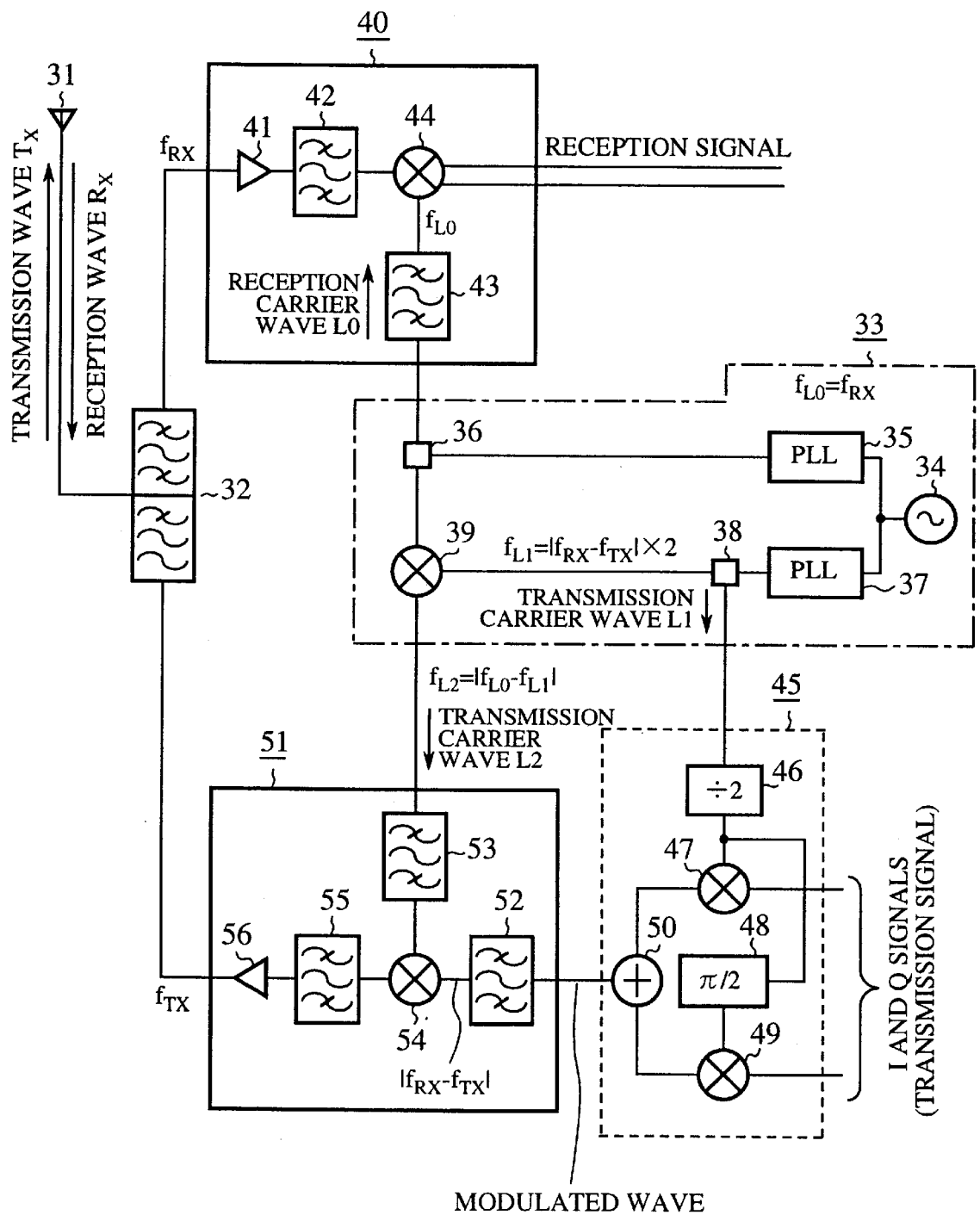
FIG. 2 is a constitutional diagram showing a transmitting and receiving apparatus according to a first embodiment of the present invention.

FIG. 2 is a constitutional diagram showing a transmitting and receiving apparatus according to a first embodiment of the present invention. In FIG. 2, 31 indicates an antenna, 32 indicates a duplexer (hereinafter, called DUP) for outputting a reception wave Rx received in the antenna 31 to a receiving unit 40 and outputting a transmission wave Tx output from a transmitting unit 51, 33 indicates a carrier wave generating unit (carrier wave generating means) for generating a reception carrier wave L0 having the same frequency as a reception frequency $f_{Rx}$ of the reception wave Rx, generating a transmission carrier wave L1 (first transmission carrier wave) of which a frequency $f_{L1}$ is equivalent to twice of a difference value between the reception frequency $f_{Rx}$ and a transmission frequency $f_{TX}$, and generating a transmission carrier wave L2 (second transmission carrier wave) of which a frequency $f_{L2}$ is equivalent to a difference value between a frequency $f_{L0}$ and the transmission frequency $f_{L1}$, 34 indicates a local oscillating unit, 35 indicates a phased-lock-loop synthesizer (hereinafter, called PLL) for generating the reception carrier wave L0 of the frequency $f_{L0}$ (=$f_{Rx}$), 36 indicates a distributing unit for distributing the reception carrier wave L0 generated in the PLL 35, 37 indicates a PLL for generating the transmission carrier wave L1 of the frequency $f_{L1}$, 38 indicates a distributing unit for distributing the transmission carrier wave L1 generated in the PLL 37, 39 indicates a mixer (hereinafter, called MIX) for mixing the reception carrier wave L0 with the transmission carrier wave L1 and outputting the transmission carrier wave L2.

Also, 40 indicates the receiving unit (receiving means) for mixing the reception carrier wave L0 generated in the carrier wave generating unit 33 with the reception wave Rx and outputting a reception signal denoting a base band signal, 41 indicates an amplifying unit for amplifying the reception wave Rx, 42 indicates a band pass filter, 43 indicates a filter for removing higher harmonic waves from the reception carrier wave L0 generated in the carrier wave generating unit 33, and 44 indicates an MIX for mixing the reception carrier wave L0 with the reception wave Rx.

Also, 45 indicates an orthogonal modulation unit (modulating means) for halving (or de-multiplying by 2) the frequency of the transmission carrier wave L1 generated in the carrier wave generating unit 33, mixing the transmission carrier wave L1 of a halved frequency with a transmission signal denoting the base band signal and outputting a modulated wave, 46 indicates a 2-frequency demultiplier for halving (or de-multiplying by 2) the frequency of the transmission carrier wave L1 generated in the carrier wave generating unit 33, 47 indicates an MIX for mixing the transmission carrier wave L1 halved in the 2-frequency demultiplier 46 with an I signal denoting a base band signal, 48 indicates a phase shifter for shifting the phase of the transmission carrier wave L1 halved in the 2-frequency demultiplier 46 by /2, 49 indicates an MIX for mixing the transmission carrier wave L1 output from the phase shifter 48 with a Q signal denoting a base band signal, and 50 indicates a synthesizer for synthesizing the modulated wave from a mixed wave output from the MIX 47 and a mixed wave output from the MIX 49 and outputting the modulated wave.

In addition, 51 indicates the transmitting unit for mixing the transmission carrier wave L2 generated in the carrier wave generating unit 33 with the modulated wave and outputting the transmission wave Tx, 52 indicates a filter for removing higher harmonic waves from the modulated wave which is output from the orthogonal modulation unit 45, 53 indicates a filter for removing higher harmonic waves from the transmission carrier wave L2 generated in the carrier wave generating unit 33, 54 indicates an MIX for mixing the transmission carrier wave L2 with the modulated wave, 55 indicates a band pass filter, and 56 indicates an amplifier for amplifying the transmission wave Tx.

Next, an operation is described.

A reception carrier wave L0 having the same frequency as the reception frequency $f_{Rx}$ of the reception wave Rx is initially generated in the carrier wave generating unit 33 to directly obtain a reception signal of a desired frequency (for example, 4.096 MHz) from the reception wave Rx.

Thereafter, when the reception carrier wave L0, of which a frequency $f_{L0}$ agrees with the reception frequency $f_{Rx}$, is generated in the carrier wave generating unit 33, the reception carrier wave L0 is mixed with the reception wave Rx in the receiving unit 40, and the reception signal is output from the receiving unit 40.

Therefore, the reception signal of the desired frequency can be taken in.

Also, to obtain a transmission wave Tx of a desired frequency from a transmission signal, a transmission carrier wave L1, of which a frequency $f_{L1}$ is equivalent to twice of a difference value between the reception frequency $f_{Rx}$ and the transmission frequency $f_{TX}$ (that is, the frequency $f_{L1}$ is expressed by $f_{RX}-f_{TX}$ 2), is generated in the carrier wave generating unit 33, and a transmission carrier wave L2, of which a frequency $f_{L2}$ is equivalent to a difference value between the frequency $f_{L0}$ and the frequency $f_{L1}$ (that is, the frequency $f_{L2}$ is expressed by $f_{L0}-f_{L1}$), is generated in the carrier wave generating unit 33.

Thereafter, when the transmission carrier wave L1 of the frequency $f_{L1}$ is generated in the carrier wave generating unit 33, the frequency $f_{L1}$ of the transmission carrier wave L1 is halved in the orthogonal modulation unit 45, the transmission carrier wave L1 of a halved frequency $f_{L1}/2$ is mixed with the transmission signal denoting the base band signal in the orthogonal modulation unit 45, and a modulated wave is output from the orthogonal modulation unit 45.

Here a frequency of the modulated wave output from the orthogonal modulation unit 45 equals to $f_{Rx}-f_{TX}$ and differs from that of the transmission carrier wave L1.

Thereafter, when the modulated wave is output from the orthogonal modulation unit 45, the transmission carrier wave L2 of the frequency $f_{L2}$ generated in the carrier wave generating unit 33 is mixed with the modulated wave in the transmitting unit 51, and the transmission wave Tx is output from the transmitting unit 51.

Therefore, the transmission wave Tx of the transmission frequency $f_{TX}$ can be transmitted.

As is apparent in the above description, the transmission carrier wave L1, of which the frequency $f_{L1}$ is equivalent to twice of the difference value between the reception frequency $f_{Rx}$ and the transmission frequency $f_{TX}$, is generated, and the transmission carrier wave L2, of which the frequency $f_{L2}$ is equivalent to the difference value between the frequency $f_{L0}$ and the frequency $f_{L1}$, is generated. Therefore, either the frequency $f_{L1}$ of the transmission carrier wave L1 or the frequency $f_{L2}$ of the transmission carrier wave L2 does not agree with each of the frequency $f_{Rx}-f_{TX}$ of the modulated wave and the transmission frequency $f_{Tx}$. As a result, there is no probability that the transmission wave Tx leaks out to interfere with the carrier wave generating unit 33, and there is no probability that the transmission carrier wave L1 and the modulated wave interfere with each other. Therefore, the degradation of the modulation precision on the transmission side can be prevented.

Also, the frequency $f_{L1}$ of the transmission carrier wave L1 is halved in the orthogonal modulation unit 45. Therefore, there is no probability that the transmission carrier wave L1 directly leaks out to the orthogonal modulation unit 45, and the interference with the transmission signal band can be reduced.

Figure 1:
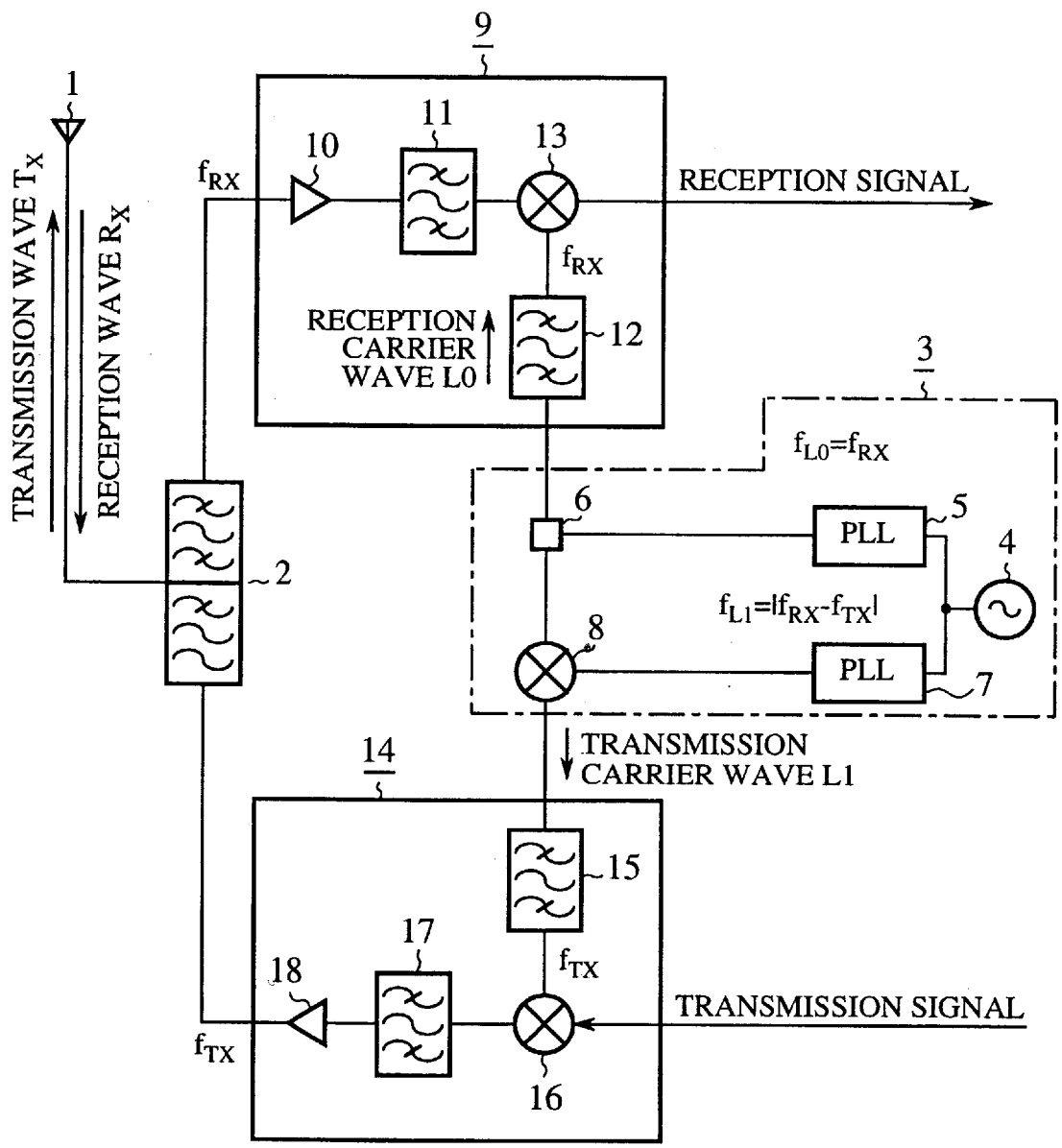
FIG. 1 is a constitutional diagram showing a conventional transmitting and receiving apparatus.

Also, there is an effect that the transmission carrier wave L1 and the transmission carrier wave L2, of which the frequencies differ from each other, can be produced only by adding a small-sized element, which occupies a small area, to the transmitting and receiving apparatus (the distributing unit is added as compared with the conventional example shown in FIG. 1).

Embodiment 2

Figure 3:
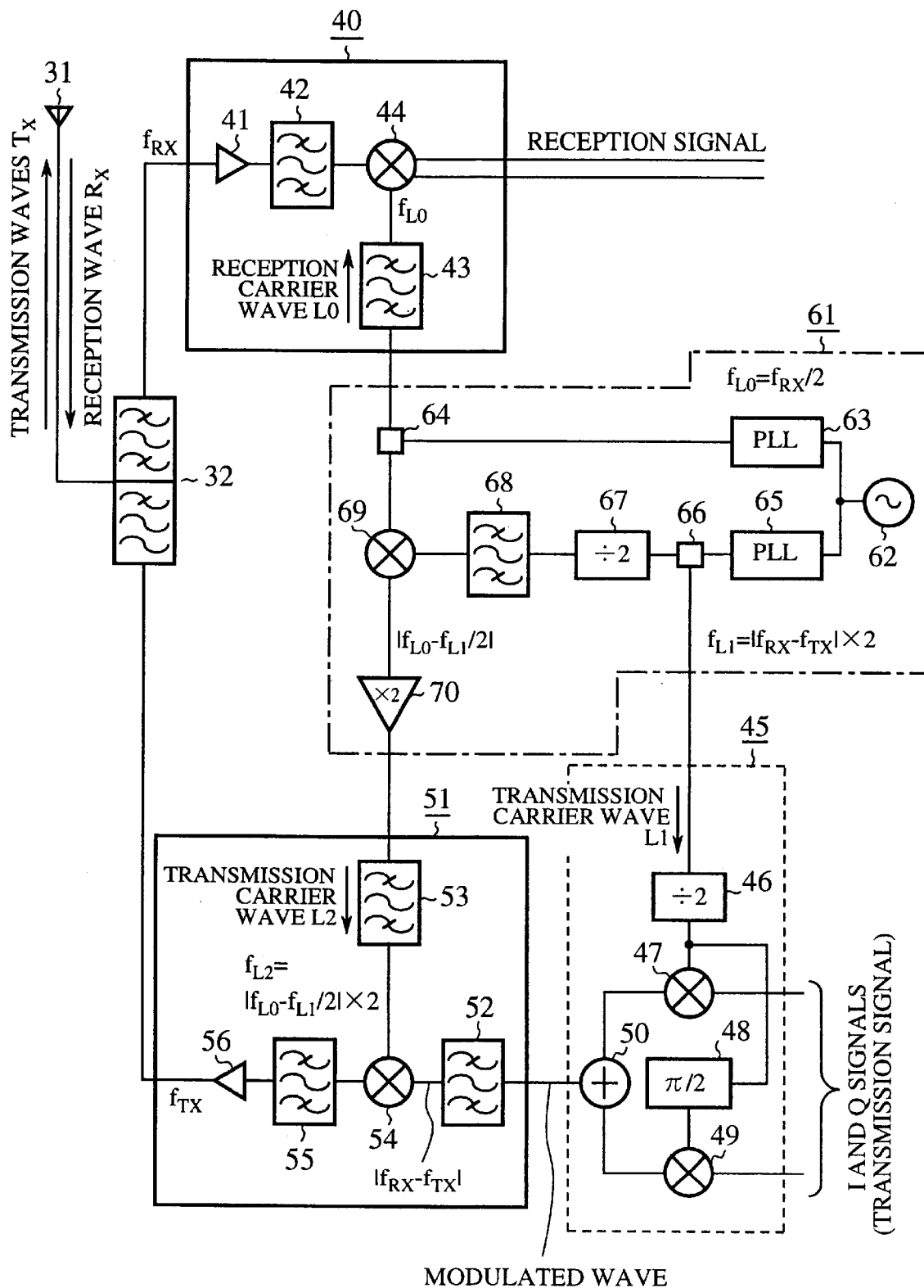
FIG. 3 is a constitutional diagram showing a transmitting and receiving apparatus according to a second embodiment of the present invention.

FIG. 3 is a constitutional diagram showing a transmitting and receiving apparatus according to a second embodiment of the present invention. In FIG. 3, because the same reference numerals as those used in FIG. 2 indicate the same constituent elements as those or the equivalent constituent elements to those indicated by the reference numerals in FIG. 2, the description of the constituent elements shown in FIG. 3 is omitted.

61 indicates a carrier wave generating unit (carrier wave generating means) for generating a reception carrier wave L0 of which a frequency $f_{L0}$ is equivalent to half of the reception frequency $f_{Rx}$, generating a transmission carrier wave L1 of which a frequency $f_{L1}$ is equivalent to twice of a difference value between the reception frequency $f_{Rx}$ and the transmission frequency $f_{TX}$, and generating a transmission carrier wave L2 of which a frequency $f_{L2}$ is equivalent to twice of a difference value between the frequency $f_{L0}$ and half of the frequency $f_{L1}$, 62 indicates a local oscillating unit, 63 indicates a PLL for generating the reception carrier wave L0 of the frequency $f_{L0}$, 64 indicates a distributing unit for distributing the reception carrier wave L0 generated in the PLL 63, 65 indicates a PLL for generating the transmission carrier wave L1 of the frequency $f_{L1}$, 66 indicates a distributing unit for distributing the transmission carrier wave L1 generated in the PLL 65, 67 indicates a 2-frequency demultiplier for halving (or de-multiplying by 2) the frequency $f_{L1}$ of the transmission carrier wave L1, 68 indicates a filter for removing higher harmonic waves from the transmission carrier wave L1 of which the frequency $f_{L1}$ is halved in the 2-frequency demultiplier 67, 69 indicates an MIX for mixing the reception carrier wave L0 with the transmission carrier wave L1 of which the frequency $f_{L1}$ is halved in the 2-frequency demultiplier 67, and 70 indicates a 2-frequency multiplier for doubling (or multiplying by 2) a frequency of a mixed wave output from the MIX 69.

Here, as is described in the first embodiment, 44 indicates the MIX for mixing the reception carrier wave L0 with the reception wave Rx. However, in the second embodiment and embodiments following the second embodiment, because the frequency $f_{L0}$ of the reception carrier wave L0 is set to be half of the reception frequency $f_{Rx}$, an even-higher harmonic wave mixer is used as the MIX 44.

Next, an operation is described.

A reception carrier wave L0, of which a frequency $f_{L0}$ is equivalent to half of the reception frequency $f_{Rx}$, is initially generated in the carrier wave generating unit 61 to directly obtain a reception signal of a desired frequency from the reception wave Rx.

Thereafter, when the reception carrier wave L0, of which the frequency $f_{L0}$ is equivalent to half of the reception frequency $f_{Rx}$, is generated in the carrier wave generating unit 61, the reception carrier wave L0 is mixed with the reception wave Rx in the receiving unit 40, and the reception signal is output from the receiving unit 40.

Therefore, the reception signal of the desired frequency can be taken in. However, the MIX 44 of the receiving unit 40 according to the second embodiment is formed of an even-higher harmonic wave mixer, and the frequency $f_{L0}$ of the reception carrier wave L0 differs from the reception frequency $f_{Rx}$.

Also, to obtain a transmission wave Tx of a desired frequency from a transmission signal, a transmission carrier wave L1, of which a frequency $f_{L1}$ is equivalent to twice of a difference value between the reception frequency $f_{Rx}$ and the transmission frequency $f_{TX}$ (that is, the frequency $f_{L1}$ is expressed by $f_{Rx}-f_{TX}$ 2), is generated in the carrier wave generating unit 61, and a transmission carrier wave L2, of which a frequency $f_{L2}$ is equivalent to twice of a difference value between the frequency $f_{L0}$ and half of the frequency $f_{L1}$ (that is, the frequency $f_{L2}$ is expressed by $f_{L0}-f_{L1}/2$ 2), is generated in the carrier wave generating unit 61.

Thereafter, when the transmission carrier wave L1 of the frequency $f_{L1}$ is generated in the carrier wave generating unit 61, the frequency $f_{L1}$ of the transmission carrier wave L1 is halved in the orthogonal modulation unit 45, the transmission carrier wave L1 of a frequency $f_{L1}/2$ is mixed with the transmission signal denoting the base band signal in the orthogonal modulation unit 45, and a modulated wave is output from the orthogonal modulation unit 45.

Here a frequency of the modulated wave output from the orthogonal modulation unit 45 equals to $f_{Rx}-f_{TX}$ and differs from that of the transmission carrier wave L1.

Thereafter, when the modulated wave is output from the orthogonal modulation unit 45, the transmission carrier wave L2 of the frequency $f_{L2}$ generated in the carrier wave generating unit 61 is mixed with the modulated wave in the transmitting unit 51, and the transmission wave Tx is output from the transmitting unit 51.

Therefore, the transmission wave Tx of the transmission frequency $f_{TX}$ can be transmitted.

As is apparent in the above description, in the second embodiment, the reception carrier wave L0, of which the frequency $f_{L0}$ is equivalent to half of the reception frequency $f_{Rx}$, is generated, the transmission carrier wave L1, of which the frequency $f_{L1}$ is equivalent to twice of the difference value between the reception frequency $f_{Rx}$ and the transmission frequency $f_{TX}$, is generated, and the transmission carrier wave L2, of which the frequency $f_{L2}$ is equivalent to twice of the difference value between the frequency $f_{L0}$ and half of the frequency $f_{L1}$, is generated. Therefore, because the frequency $f_{L0}$ of the reception carrier wave L0 does not agree with the reception frequency $f_{Rx}$, there is no probability that the reception carrier wave L0 leaks out to a front end portion (the antenna 31 and the DUP 32) to generate interference in a base band portion. Therefore the problem that a DC offset occurs in the receiving signal can be solved.

Also, in the same manner as in the first embodiment, either the frequency $f_{L1}$ of the transmission carrier wave L1 or the frequency $f_{L2}$ of the transmission carrier wave L2 does not agree with each of the frequency $f_{Rx}$–$f_{TX}$ of the modulated wave and the transmission frequency $f_{Tx}$. Therefore, the degradation of the modulation precision on the transmission side can be prevented.

Also, the frequency $f_{L1}$ of the transmission carrier wave L1 is halved in the orthogonal modulation unit 45. Therefore, there is no probability that the transmission carrier wave L1 directly leaks out to the orthogonal modulation unit 45, and the interference with the transmission signal band can be reduced.

Also, in cases where a mixer, which can be easily arranged in an integrated circuit and can be made small, is used, no PLL is additionally required (one distributing unit, one 2-frequency demultiplier and one 2-frequency multiplier are additionally arranged as compared with the configuration of the conventional example shown in FIG. 1), and there is an effect that the transmission carrier wave L1 and the transmission carrier wave L2, of which the frequencies differ from each other, can be produced.

Embodiment 3

Figure 4:
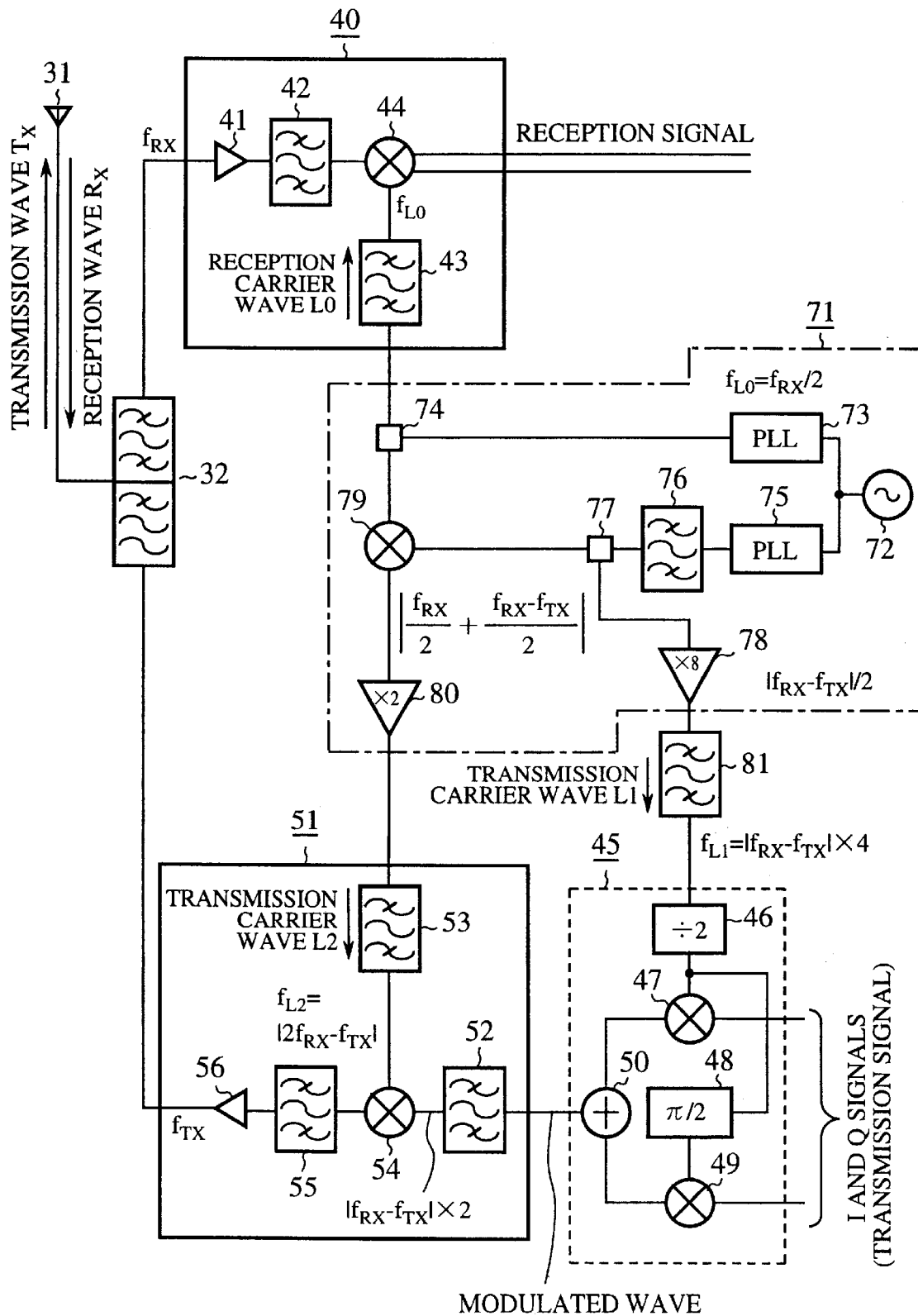
FIG. 4 is a constitutional diagram showing a transmitting and receiving apparatus according to a third embodiment of the present invention.

FIG. 4 is a constitutional diagram showing a transmitting and receiving apparatus according to a third embodiment of the present invention. In FIG. 4, because the same reference numerals as those used in FIG. 2 indicate the same constituent elements as those or the equivalent constituent elements to those indicated by the reference numerals in FIG. 2, the description of the constituent elements shown in FIG. 4 is omitted.

71 indicates a carrier wave generating unit (carrier wave generating means) for generating a reception carrier wave L0, of which a frequency $f_{L0}$ is equivalent to half of the reception frequency $f_{Rx}$, generating a transmission carrier wave L1 of which a frequency $f_{L1}$ is equivalent to four times of a difference value between the reception frequency $f_{RX}$ and the transmission frequency $f_{TX}$, and generating a transmission carrier wave L2 of which a frequency $f_{L2}$ is equivalent to a difference value between twice of the reception frequency $f_{RX}$ and the transmission frequency $f_{TX}$, 72 indicates a local oscillating unit, 73 indicates a PLL for generating the reception carrier wave L0 of the frequency $f_{L0}$, 74 indicates a distributing unit for distributing the reception carrier wave L0 generated in the PLL 73, 75 indicates a PLL for generating a carrier wave of which a frequency is equivalent to half of a difference value between the reception frequency $f_{Rx}$ and the transmission frequency $f_{TX}$, 76 indicates a filter, 77 indicates a distributing unit for distributing the carrier wave generated in the PLL 75, 78 indicates an 8-frequency multiplier for octupling (or multiplying by 8) the frequency of the carrier wave distributed in the distributing unit 77 and generating the frequency $f_{L1}$ of the transmission carrier wave L1, 79 indicates an MIX for mixing the carrier wave distributed in the distributing unit 77 with the reception carrier wave L0, 80 indicates a 2-frequency multiplier for doubling (or multiplying by 2) a frequency of a mixed wave output from the MIX 79, and 81 indicates a filter for removing higher harmonic waves from the transmission carrier wave L1 which is output from the 8-frequency multiplier 78.

Next, an operation is described.

A reception carrier wave L0, of which a frequency $f_{L0}$ is equivalent to half of the reception frequency $f_{Rx}$, is initially generated in the carrier wave generating unit 71 to directly obtain a reception signal of a desired frequency from the reception wave Rx.

Thereafter, when the reception carrier wave L0, of which the frequency $f_{L0}$ is equivalent to half of the reception frequency $f_{Rx}$, is generated in the carrier wave generating unit 71, the reception carrier wave L0 is mixed with the reception wave Rx in the receiving unit 40, and the reception signal is output from the receiving unit 40.

Therefore, the reception signal of the desired frequency can be taken in.

Also, to obtain a transmission wave Tx of a desired frequency from a transmission signal, a transmission carrier wave L1, of which a frequency $f_{L1}$ is equivalent to four times of a difference value between the reception frequency $f_{Rx}$ and the transmission frequency $f_{TX}$ (that is, the frequency $f_{L1}$ is expressed by $f_{Rx}$–$f_{Tx}$ 4), is generated in the carrier wave generating unit 71, and a transmission carrier wave L2, of which a frequency $f_{L2}$ is equivalent to a difference value between twice of the reception frequency $f_{Rx}$ and the transmission frequency $f_{TX}$ (that is, the frequency $f_{L2}$ is expressed by $2f_{RX}$–$f_{TX}$), is generated in the carrier wave generating unit 71.

Thereafter, when the transmission carrier wave L1 of the frequency $f_{L1}$ is generated in the carrier wave generating unit 71, the frequency $f_{L1}$ of the transmission carrier wave L1 is halved in the orthogonal modulation unit 45, the transmission carrier wave L1 of a frequency $f_{L1}/2$ is mixed with the transmission signal denoting the base band signal in the orthogonal modulation unit 45, and a modulated wave is output from the orthogonal modulation unit 45.

Thereafter, when the modulated wave is output from the orthogonal modulation unit 45, the transmission carrier wave L2 of the frequency $f_{L2}$ generated in the carrier wave generating unit 71 is mixed with the modulated wave in the transmitting unit 51, and the transmission wave Tx is output from the transmitting unit 51.

Therefore, the transmission wave Tx of the transmission frequency $f_{TX}$ can be transmitted.

As is apparent in the above description, in the third embodiment, the reception carrier wave L0, of which the frequency $f_{L0}$ is equivalent to half of the reception frequency $f_{Rx}$, is generated, the transmission carrier wave L1, of which the frequency $f_{L1}$ is equivalent to four times of the difference value between the reception frequency $f_{Rx}$ and the transmission frequency $f_{TX}$, is generated, and the transmission carrier wave L2, of which the frequency $f_{L2}$ is equivalent to the difference value between twice of the reception frequency $f_{Rx}$ and the transmission frequency $f_{TX}$, is generated. Therefore, in the same manner as in the second embodiment, there is no probability that an area occupied by the elements of the transmitting and receiving apparatus is enlarged, and there is an effect that the occurrence of a DC offset and the degradation of the modulation precision can be prevented.

Also, the frequency $f_{L1}$ of the transmission carrier wave L1 is halved in the orthogonal modulation unit 45. Therefore, there is no probability that the transmission carrier wave L1 directly leaks out to the orthogonal modulation unit 45, and the interference with the transmission signal band can be reduced.

Also, there is an effect that the transmission carrier wave L1 and the transmission carrier wave L2, of which the frequencies differ from each other, can be produced only by adding a small-sized constituent element, which occupies only a small area, to the transmitting and receiving apparatus.

Embodiment 4

Figure 5:
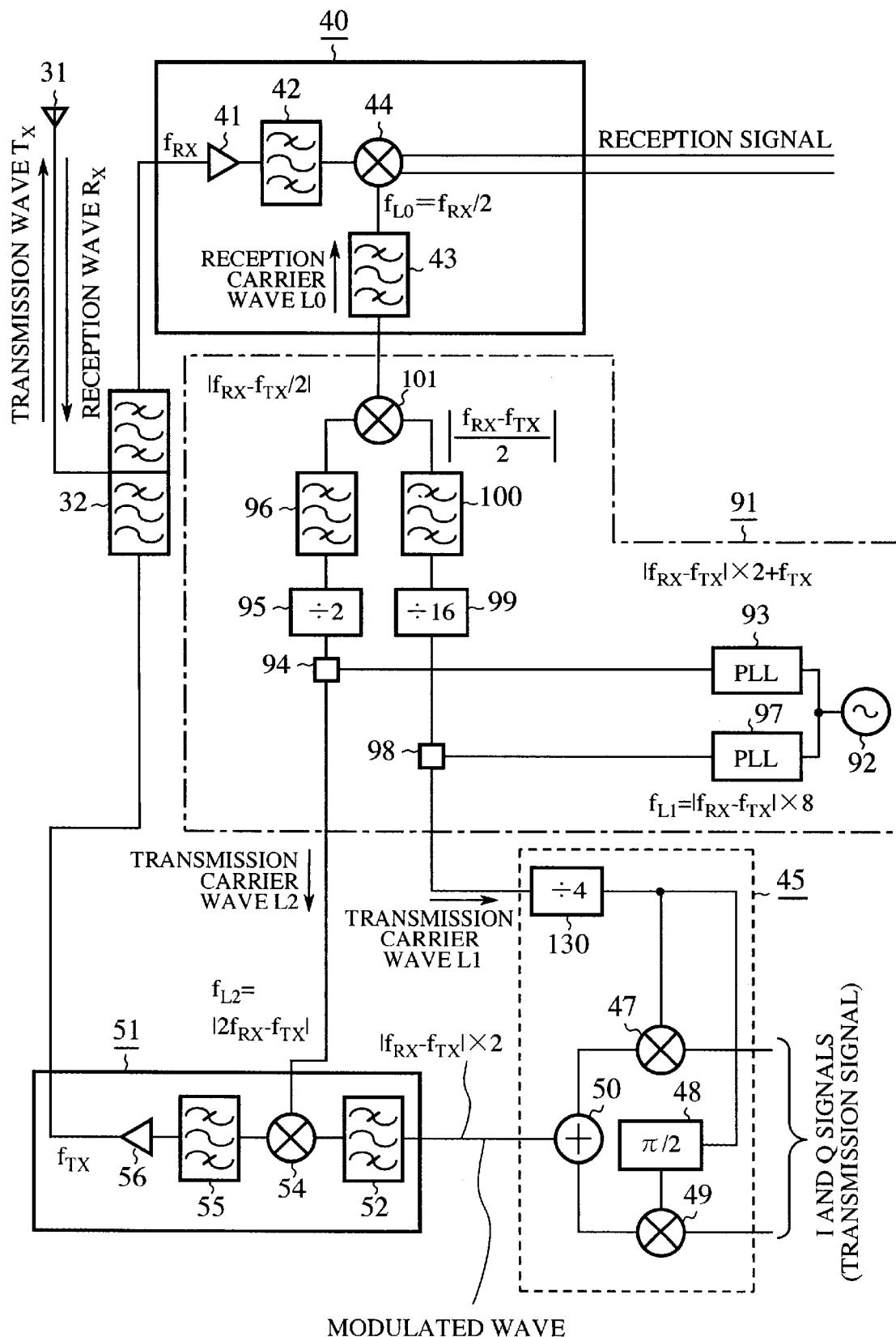
FIG. 5 is a constitutional diagram showing a transmitting and receiving apparatus according to a fourth embodiment of the present invention.

FIG. 5 is a constitutional diagram showing a transmitting and receiving apparatus according to a fourth embodiment of the present invention. In FIG. 5, because the same reference numerals as those used in FIG. 2 indicate the same constituent elements as those or the equivalent constituent elements to those indicated by the reference numerals in FIG. 2, the description of the constituent elements shown in FIG. 5 is omitted.

91 indicates a carrier wave generating unit (carrier wave generating means) for generating a reception carrier wave L0 of which a frequency $f_{L0}$ is equivalent to half of the reception frequency $f_{Rx}$, generating a transmission carrier wave L1 of which a frequency $f_{L1}$ is equivalent to eight times of a difference value between the reception frequency $f_{Rx}$ and the transmission frequency $f_{TX}$, and generating a transmission carrier wave L2 of which a frequency $f_{L2}$ is equivalent to a difference value between twice of the reception frequency $f_{Rx}$ and the transmission frequency $f_{TX}$, 92 indicates a local oscillating unit, 93 indicates a PLL for generating the reception carrier wave L2 of the frequency $f_{L2}$, 94 indicates a distributing unit for distributing the transmission carrier wave L2 generated in the PLL 93, 95 indicates a 2-frequency demultiplier for halving (or de-multiplying by 2) the frequency $f_{L2}$ of the reception carrier wave L2 distributed in the distributing unit 94, 96 indicates a filter for removing higher harmonic waves from a carrier wave output from the 2-frequency demultiplier 95, 97 indicates a PLL for generating the transmission carrier wave L1 of the frequency $f_{L1}$, 98 indicates a distributing unit for distributing the transmission carrier wave L1 generated in the PLL 97, 99 indicates a 16-frequency demultiplier for de-multiplying by 16 the frequency $f_{L1}$ of the transmission carrier wave L1 distributed in the distributing unit 98 to produce a carrier wave of a frequency $f_{L1}/16$, 100 indicates a filter for removing higher harmonic waves from the carrier wave output from the 16-frequency demultiplier 99, and 101 indicates an MIX for mixing the carrier wave output from the filter 96 with the carrier wave output from the filter 100 and outputting the reception carrier wave L0.

Next, an operation is described.

A reception carrier wave L0, of which a frequency $f_{L0}$ is equivalent to half of the reception frequency $f_{RX}$, is initially generated in the carrier wave generating unit 91 to directly obtain a reception signal of a desired frequency from the reception wave Rx.

Thereafter, when the reception carrier wave L0, of which the frequency $f_{L0}$ is equivalent to half of the reception frequency $f_{Rx}$, is generated in the carrier wave generating unit 91, the reception carrier wave L0 is mixed with the reception wave Rx in the receiving unit 40, and the reception signal is output from the receiving unit 40.

Therefore, the reception signal of the desired frequency can be taken in.

Also, to obtain a transmission wave Tx of a desired frequency from a transmission signal, a transmission carrier wave L1, of which a frequency $f_{L1}$ is equivalent to eight times of a difference value between the reception frequency $f_{Rx}$ and the transmission frequency $f_{TX}$ (that is, the frequency $f_{L1}$ is expressed by $f_{Rx}-f_{Tx}$ 8), is generated in the carrier wave generating unit 91, and a transmission carrier wave L2, of which a frequency $f_{L2}$ is equivalent to a difference value between twice of the reception frequency $f_{Rx}$ and the transmission frequency $f_{TX}$ (that is, the frequency $f_{L2}$ is expressed by $2f_{Rx}-f_{TX}$), is generated in the carrier wave generating unit 91.

Thereafter, when the transmission carrier wave L1 of the frequency $f_{L1}$ is generated in the carrier wave generating unit 91, the frequency $f_{L1}$ of the transmission carrier wave L1 is halved in the orthogonal modulation unit 45, the transmission carrier wave L1 of a frequency $f_{L1}/2$ is mixed with the transmission signal denoting the base band signal in the orthogonal modulation unit 45, and a modulated wave is output from the orthogonal modulation unit 45.

Thereafter, when the modulated wave is output from the orthogonal modulation unit 45, the transmission carrier wave L2 of the frequency $f_{L2}$ generated in the carrier wave generating unit 91 is mixed with the modulated wave in the transmitting unit 51, and the transmission wave Tx is output from the transmitting unit 51.

Therefore, the transmission wave Tx of the transmission frequency $f_{TX}$ can be transmitted.

As is apparent in the above description, in the fourth embodiment, the reception carrier wave L0, of which the frequency $f_{L0}$ is equivalent to half of the reception frequency $f_{Rx}$, is generated, the transmission carrier wave L1, of which the frequency $f_{L1}$ is equivalent to eight times of the difference value between the reception frequency $f_{Rx}$ and the transmission frequency $f_{TX}$, is generated, and the transmission carrier wave L2, of which the frequency $f_{L2}$ is equivalent to the difference value between twice of the reception frequency $f_{Rx}$ and the transmission frequency $f_{TX}$, is generated. Therefore, in the same manner as in the second embodiment, there is no probability that an area occupied by the constituent elements of the transmitting and receiving apparatus is enlarged, and there is an effect that the occurrence of a DC offset and the degradation of the modulation precision can be prevented.

Also, the frequency $f_{L1}$ of the transmission carrier wave L1 is halved in the orthogonal modulation unit 45. Therefore, there is no probability that the transmission carrier wave L1 directly leaks out to the orthogonal modulation unit 45, and the interference with the transmission signal band can be reduced.

Also, there is an effect that the transmission carrier wave L1 and the transmission carrier wave L2, of which the frequencies differ from each other, can be produced only by adding a small-sized constituent element, which occupies only a small area, to the transmitting and receiving apparatus.

In the fourth embodiment, the reception carrier wave L0, of which the frequency $f_{L0}$ is equivalent to half of the reception frequency $f_{Rx}$, is generated, the transmission carrier wave L1, of which the frequency $f_{L1}$ is equivalent to eight times of the difference value between the reception frequency $f_{Rx}$ and the transmission frequency $f_{TX}$, is generated, and the frequency $f_{L1}$ of the transmission carrier wave L1 is divided by four in the divide-by-4 frequency demultiplier 130. However, in cases where a transmission carrier wave L1, of which a frequency $f_{L1}$ is equivalent to 8N times (N is a natural number, and 8N times denotes sixteenth times in case of N=2) of the difference value between the reception frequency $f_{Rx}$ and the transmission frequency $f_{TX}$, is generated, a 4N-frequency demultiplier is arranged in place of the divide-by-4 frequency demultiplier 130. Therefore, the same effect as that obtained by arranging the divide-by-4 frequency demultiplier 130 can be obtained.

However, as the number N is increased, the size of the 4N-frequency demultiplier is generally enlarged, and the modulation precision generally becomes worse. Therefore, the selection of N=1 is preferred.

Embodiment 5

Figure 6:
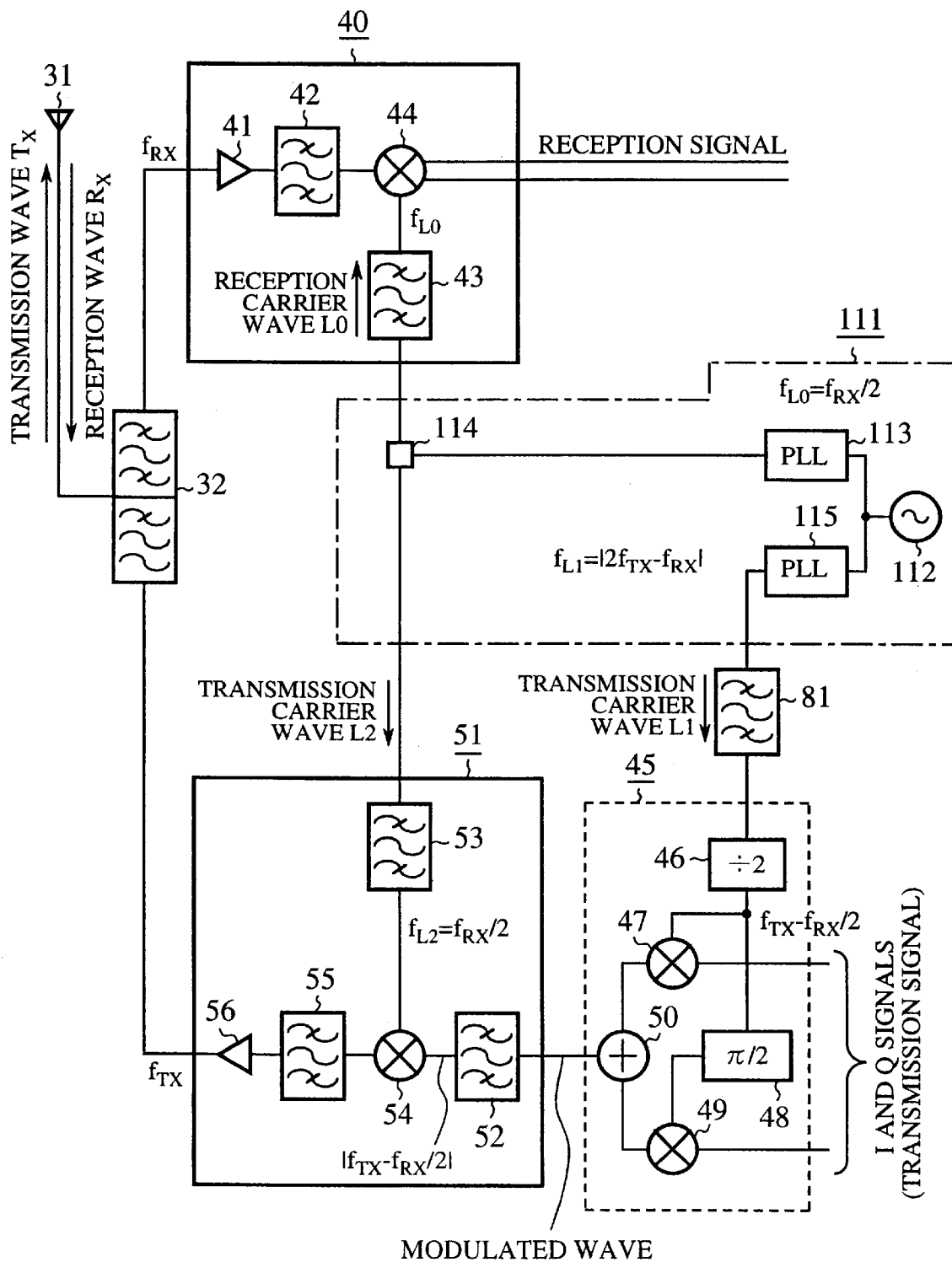
FIG. 6 is a constitutional diagram showing a transmitting and receiving apparatus according to a fifth embodiment of the present invention.

FIG. 6 is a constitutional diagram showing a transmitting and receiving apparatus according to a fifth embodiment of the present invention. In FIG. 6, because the same reference numerals as those used in FIG. 2 indicate the same constituent elements as those or the equivalent constituent elements to those indicated by the reference numerals in FIG. 2, the description of the constituent elements shown in FIG. 6 is omitted.

111 indicates a carrier wave generating unit (carrier wave generating means) for generating a reception carrier wave L0 of which a frequency $f_{L0}$ is equivalent to half of the reception frequency $f_{Rx}$, generating a transmission carrier wave L1 of which a frequency $f_{L1}$ is equivalent to a difference value between twice of the transmission frequency $f_{TX}$ and the reception frequency $f_{Rx}$, and generating a transmission carrier wave L2 of which a frequency $f_{L2}$ is equivalent to half of the reception frequency $f_{Rx}$, 112 indicates a local oscillating unit, 113 indicates a PLL for generating a carrier wave of the frequency $f_{L0}$ ($=f_{L2}=f_{Rx}/2$), 114 indicates a distributing unit for distributing the carrier wave generated in the PLL 113 and outputting the reception carrier wave L0 and the transmission carrier wave L2, and 115 indicates a PLL for generating the transmission carrier wave L1.

Next, an operation is described.

A reception carrier wave L0, of which a frequency $f_{L0}$ is equivalent to half of the reception frequency $f_{Rx}$, is initially generated in the carrier wave generating unit 111 to directly obtain a reception signal of a desired frequency from the reception wave Rx.

Thereafter, when the reception carrier wave L0, of which the frequency $f_{L0}$ is equivalent to half of the reception frequency $f_{Rx}$, is generated in the carrier wave generating unit 111, the reception carrier wave L0 is mixed with the reception wave Rx in the receiving unit 40, and the reception signal is output from the receiving unit 40.

Therefore, the reception signal of the desired frequency can be taken in.

Also, to obtain a transmission wave Tx of a desired frequency from a transmission signal, a transmission carrier wave L1, of which a frequency $f_{L1}$ is equivalent to a difference value between twice of the transmission frequency $f_{TX}$ and the reception frequency $f_{Rx}$ (that is, the frequency $f_{L1}$ is expressed by $2f_{TX}-f_{Rx}$), is generated in the carrier wave generating unit 111, and a transmission carrier wave L2, of which a frequency $f_{L2}$ is equivalent to half of the reception frequency $f_{Rx}$, is generated in the carrier wave generating unit 111.

Thereafter, when the transmission carrier wave L1 of the frequency $f_{L1}$ is generated in the carrier wave generating unit 111, the frequency $f_{L1}$ of the transmission carrier wave L1 is halved in the orthogonal modulation unit 45, the transmission carrier wave L1 of a frequency $f_{L1}/2$ is mixed with the transmission signal denoting the base band signal in the orthogonal modulation unit 45, and a modulated wave is output from the orthogonal modulation unit 45.

Thereafter, when the modulated wave is output from the orthogonal modulation unit 45, the transmission carrier wave L2 of the frequency $f_{L2}$ generated in the carrier wave generating unit 111 is mixed with the modulated wave in the transmitting unit 51, and the transmission wave Tx is output from the transmitting unit 51.

Therefore, the transmission wave Tx of the transmission frequency $f_{TX}$ can be transmitted.

As is apparent in the above description, in the fifth embodiment, the reception carrier wave L0, of which the frequency $f_{L0}$ is equivalent to half of the reception frequency $f_{Rx}$, is generated, the transmission carrier wave L1, of which the frequency $f_{L1}$ is equivalent to a difference value between twice of the transmission frequency $f_{TX}$ and the reception frequency $f_{Rx}$, is generated, and the transmission carrier wave L2, of which the frequency $f_{L2}$ is equivalent to half of the reception frequency $f_{Rx}$, is generated. Therefore, in the same manner as in the second embodiment, there is no probability that an area occupied by the elements of the transmitting and receiving apparatus is enlarged, and there is an effect that the occurrence of a DC offset and the degradation of the modulation precision can be prevented.

Also, the frequency $f_{L1}$ of the transmission carrier wave L1 is halved in the orthogonal modulation unit 45. Therefore, there is no probability that the transmission carrier wave L1 directly leaks out to the orthogonal modulation unit 45, and the interference with the transmission signal band can be reduced.

Also, there is an effect that the transmission carrier wave L1 and the transmission carrier wave L2, of which the frequencies differ from each other, can be produced only by adding a small-sized constituent element, which occupies only a small area, to the transmitting and receiving apparatus.

Embodiment 6

Figure 7:
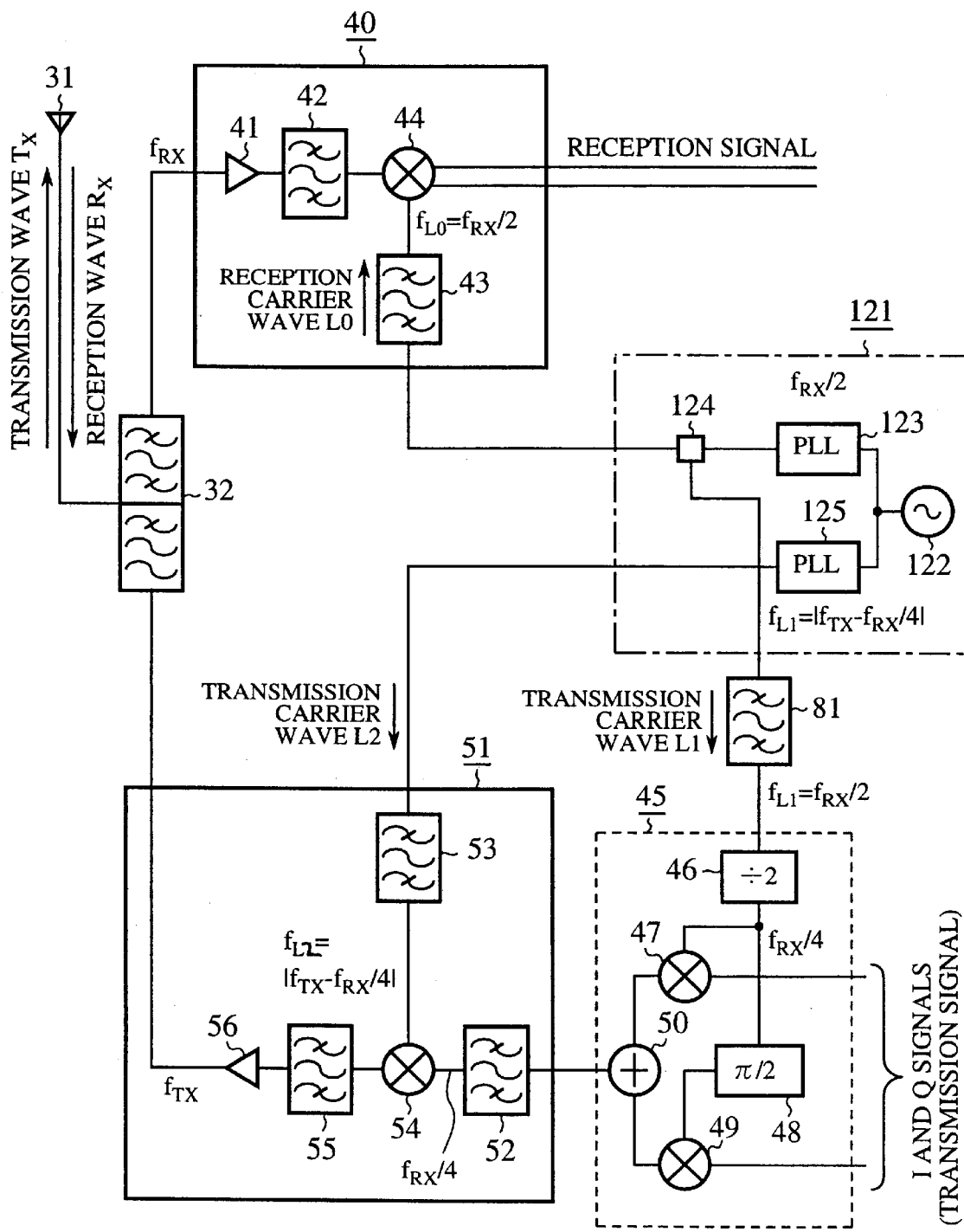
FIG. 7 is a constitutional diagram showing a transmitting and receiving apparatus according to a sixth embodiment of the present invention.

FIG. 7 is a constitutional diagram showing a transmitting and receiving apparatus according to a sixth embodiment of the present invention. In FIG. 7, because the same reference numerals as those used in FIG. 2 indicate the same constituent elements as those or the equivalent constituent elements to those indicated by the reference numerals in FIG. 2, the description of the constituent elements shown in FIG. 7 is omitted.

121 indicates a carrier wave generating unit (carrier wave generating means) for generating a reception carrier wave L0 and a transmission carrier wave L1 of which each frequency $f_{L0}$ ($=f_{L1}$) is equivalent to half of the reception frequency $f_{Rx}$, and generating a transmission carrier wave L2 of which a frequency $f_{L2}$ is equivalent to a difference value between the transmission frequency $f_{TX}$ and ¼ of the reception frequency $f_{Rx}$, 122 indicates a local oscillating unit, 123 indicates a PLL for generating a carrier wave of the frequency $f_{RX/2}$, 124 indicates a distributing unit for distributing the carrier wave generated in the PLL 123 and outputting the reception carrier wave L0 and the transmission carrier wave L1, and 125 indicates a PLL for generating the transmission carrier wave L2 of the frequency $f_{L2}$.

Next, an operation is described.

A reception carrier wave L0, of which a frequency $f_{L0}$ is equivalent to half of the reception frequency $f_{Rx}$, is initially generated in the carrier wave generating unit 121 to directly obtain a reception signal of a desired frequency from the reception wave Rx.

Thereafter, when the reception carrier wave L0, of which the frequency $f_{L0}$ is equivalent to half of the reception frequency $f_{Rx}$, is generated in the carrier wave generating unit 121, the reception carrier wave L0 is mixed with the reception wave Rx in the receiving unit 40, and the reception signal is output from the receiving unit 40.

Therefore, the reception signal of the desired frequency can be taken in.

Also, to obtain a transmission wave Tx of a desired frequency from a transmission signal, a transmission carrier wave L1, of which a frequency $f_{L1}$ is equivalent to half of the reception frequency $f_{RX}$, is generated in the carrier wave generating unit 121, and a transmission carrier wave L2, of which a frequency $f_{L2}$ is equivalent to a difference value between the transmission frequency $f_{TX}$ and ¼ of the reception frequency $f_{Rx}$ (that is, the frequency $f_{L2}$ is expressed by $f_{TX}-f_{Rx}/4$), is generated in the carrier wave generating unit 121.

Thereafter, when the transmission carrier wave L1 of the frequency $f_{L1}$ is generated in the carrier wave generating unit 121, the frequency $f_{L1}$ of the transmission carrier wave L1 is halved in the orthogonal modulation unit 45, the transmission carrier wave L1 of a frequency $f_{L1}/2$ is mixed with the transmission signal denoting the base band signal in the orthogonal modulation unit 45, and a modulated wave is output from the orthogonal modulation unit 45.

Thereafter, when the modulated wave is output from the orthogonal modulation unit 45, the transmission carrier wave L2 of the frequency $f_{L2}$ generated in the carrier wave generating unit 121 is mixed with the modulated wave in the transmitting unit 51, and the transmission wave Tx is output from the transmitting unit 51.

Therefore, the transmission wave Tx of the transmission frequency $f_{TX}$ can be transmitted.

As is apparent in the above description, in the sixth embodiment, the reception carrier wave L0 and the transmission carrier wave L1, of which each frequency $f_{L0}$ (=$f_{L1}$) is equivalent to half of the reception frequency $f_{Rx}$, are generated, and the transmission carrier wave L2, of which the frequency $f_{L2}$ is equivalent to the difference value between the transmission frequency $f_{TX}$ and ¼ of the reception frequency $f_{Rx}$, is generated. Therefore, in the same manner as in the second embodiment, there is no probability that an area occupied by the elements of the transmitting and receiving apparatus is enlarged, and there is an effect that the occurrence of a DC offset and the degradation of the modulation precision can be prevented.

Also, the frequency $f_{L1}$ of the transmission carrier wave L1 is halved in the orthogonal modulation unit 45. Therefore, there is no probability that the transmission carrier wave L1 directly leaks out to the orthogonal modulation unit 45, and the interference with the transmission signal band can be reduced.

Also, there is an effect that the transmission carrier wave L1 and the transmission carrier wave L2, of which the frequencies differ from each other, can be produced only by adding a small-sized constituent element, which occupies only a small area, to the transmitting and receiving apparatus.

As is described above, in cases where a small-sized lightweight mobile wireless installation is required, the transmitting and receiving apparatus according to the present invention is appropriate for the mobile wireless installation in which the transmitting and receiving apparatus is arranged as a transmitter-receiver.

What is claimed is:

1. A transmitting and receiving apparatus, comprising:
   carrier wave generating means for generating a reception carrier wave having a frequency equivalent to ½ of a reception frequency, generating a first transmission carrier wave having a frequency equivalent to 8 times a difference value between the reception frequency and a transmission frequency, and generating a second transmission carrier wave having a frequency equivalent to a difference value between twice the reception frequency and the transmission frequency;
   receiving means for mixing the reception carrier wave generated by the carrier wave generating means with a reception wave and outputting a reception signal;
   modulating means for de-multiplying by 4 the frequency of the first transmission carrier wave generated by the carrier wave generating means, mixing the first transmission carrier wave, of which the frequency is de-multiplied by 4, with a transmission signal, and outputting a modulated wave; and
   transmitting means for mixing the second transmission carrier wave generated by the carrier wave generating means with the modulated wave output from the modulating means, and outputting a transmission wave.

2. A transmitting and receiving apparatus according to claim 1, wherein the reception carrier wave generated by the carrier wave generating means is obtained by de-multiplying the frequency of the first transmission carrier wave by 16, de-multiplying the frequency of the second transmission carrier wave by 2 and mixing the first transmission carrier wave, of which the frequency is de-multiplied by 16, and the second transmission carrier wave of which the frequency is de-multiplied by 2.

* * * * *